US009911477B1

(12) United States Patent
Teh

(10) Patent No.: US 9,911,477 B1
(45) Date of Patent: Mar. 6, 2018

(54) MEMORY CONTROLLER ARCHITECTURE WITH IMPROVED MEMORY SCHEDULING EFFICIENCY

(71) Applicant: Altera Corporation, San Jose, CA (US)

(72) Inventor: Chee Hak Teh, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 261 days.

(21) Appl. No.: 14/256,721

(22) Filed: Apr. 18, 2014

(51) Int. Cl.
*G06F 13/16* (2006.01)
*G11C 7/22* (2006.01)

(52) U.S. Cl.
CPC ............ *G11C 7/22* (2013.01); *G06F 13/1631* (2013.01); *G06F 13/1642* (2013.01)

(58) Field of Classification Search
CPC .................. G06F 13/1615; G06F 13/16–13/18
See application file for complete search history.

(56) References Cited

U.S. PATENT DOCUMENTS

| 5,301,278 | A | | 4/1994 | Bowater et al. | |
|---|---|---|---|---|---|
| 5,440,713 | A | * | 8/1995 | Lin | G06F 13/18 711/158 |
| 5,926,839 | A | * | 7/1999 | Katayama | G11C 7/1039 365/189.04 |
| 6,125,422 | A | | 9/2000 | May | |
| 6,571,325 | B1 | * | 5/2003 | Satagopan | G06F 13/1615 365/230.03 |
| 6,832,279 | B1 | * | 12/2004 | Potter | G06F 13/405 710/112 |
| 7,555,634 | B1 | * | 6/2009 | Thatipelli | G06F 9/383 712/216 |

(Continued)

FOREIGN PATENT DOCUMENTS

| EP | 2610874 | 7/2013 |
|---|---|---|
| WO | 2007145883 | 12/2007 |

OTHER PUBLICATIONS

Joonseok Park et al. "Synthesis of Pipelined Memory Access Controllers for Streamed Data Applications on FPGA-based Computing Engines." Oct. 2001. ACM. ISSS'01. pp. 221-226.*

(Continued)

*Primary Examiner* — Nathan Sadler
(74) *Attorney, Agent, or Firm* — Treyz Law Group, P.C.; Jason Tsai; Vineet Dixit

(57) ABSTRACT

Integrated circuits that include memory interface and controller circuitry for communicating with external memory are provided. The memory interface and controller circuitry may include a user logic interface, a memory controller, and a physical layer input-output interface. The user logic interface may be operated in a first clock domain. The memory controller may be operated in a second clock domain. The physical layer interface may be operated in a third clock domain that is an integer multiple of the second clock domain. The user logic interface may include only user-dependent blocks. The physical layer interface may include memory protocol agnostic blocks and/or memory protocol specific blocks. The memory controller may include both memory protocol agnostic blocks and memory protocol dependent blocks. The memory controller may include one or more color pipelines for scheduling memory requests in a parallel arbitration scheme.

8 Claims, 12 Drawing Sheets

(56) References Cited

U.S. PATENT DOCUMENTS

| | | |
|---|---|---|
| 7,966,439 B1 | 6/2011 | Treichler et al. |
| 7,966,468 B1 | 6/2011 | Simeral et al. |
| 8,171,334 B2 | 5/2012 | Kelly |
| 8,520,505 B1 | 8/2013 | Kruglick |
| 8,629,691 B2 | 1/2014 | Fitton et al. |
| 9,304,899 B1* | 4/2016 | Baeckler .............. G06F 12/023 |
| 9,342,402 B1* | 5/2016 | Ong .................... G06F 11/1056 |
| 2003/0033493 A1* | 2/2003 | Cismas .............. G06F 13/1626 711/158 |
| 2004/0030849 A1* | 2/2004 | Borkenhagen ...... G06F 13/1647 711/156 |
| 2004/0064646 A1* | 4/2004 | Emerson ............ G06F 13/1684 711/131 |
| 2007/0156946 A1* | 7/2007 | Lakshmanamurthy ............................ G06F 13/1631 711/5 |
| 2009/0172260 A1* | 7/2009 | Olbrich .............. G06F 13/1657 711/103 |
| 2009/0225094 A1* | 9/2009 | Fouladi .............. G06F 13/1605 345/535 |
| 2014/0223111 A1* | 8/2014 | Dinkjian ................ G06F 12/00 711/147 |
| 2014/0258620 A1* | 9/2014 | Nagarajan ........... G06F 12/0815 711/120 |
| 2014/0351526 A1* | 11/2014 | Peterson ............... G06F 13/287 711/149 |

OTHER PUBLICATIONS

Thompson. "Glitch/Noise-Free Dynamic RAM Address Multiplexing for Multiple Address Inputs." Jan. 1988. IBM Technical Disclosure Bulletin. vol. 30. pp. 221-223.*

Fang et al. "Thread-Fair Memory Request Reordering." Jun. 2012. JWAC-3. https://www.cs.utah.edu/~rajeev/jwac12/papers/paper_6.pdf.*

Rixner et al. "Memory Access Scheduling." Jun. 2000. ISCA-27. https://www.cs.rice.edu/CS/Architecture/docs/rixner-isca00.pdf.*

Kao et al. "High-Performance NAND Flash Controller Exploiting Parallel Out-of-Order Command Execution." Apr. 2010. IEEE. VSLI-DAT 2010. pp. 160-163.*

Ong et al., U.S. Appl. No. 14/166,337, filed Jan. 28, 2014.

* cited by examiner

MEMORY CONTROLLER ARCHITECTURE WITH IMPROVED MEMORY SCHEDULING EFFICIENCY

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices).

In general, the memory interface circuitry can be implemented as either an "in-order" or an "out-of-order" memory controller. In-order memory controllers process memory access requests in order and offer determinism on memory scheduling but often lack scheduling efficiency in terms of memory bandwidth utilization. Out-of-order memory controllers can process access requests out of order and can offer improved memory bandwidth utilization but the scheduling is non-deterministic.

Conventional memory interface circuitry on a programmable integrated circuit typically only addresses memory scheduling efficiency in a single usage domain (i.e., the memory interface can either be "hardened" for high performance and low power applications or can be "soft" to support slower or lower cost applications). Hardened/fixed application-specific memory interface solutions offer higher operating frequencies but pose challenges when scaling across different memory protocols and topologies. On the other hand, soft/programmable solutions offer more flexibility in supporting different memory protocols and topologies but are limited in terms of the scheduling efficiency and performance.

SUMMARY

An integrated circuit having circuitry that communicates with external memory is provided. The integrated circuit may include user logic (sometimes referred to as "core" logic), user interface circuitry that interfaces with the user logic, a physical layer (or PHY) interface circuitry that interfaces with the external memory, and memory controller circuitry interposed between the user interface and the PHY interface. In particular, the memory controller circuit may include multiple color pipelines that are operated in parallel to process memory access requests for different portions of the external memory (e.g., each color pipeline may access a different rank or bank in the external memory).

A rate matching circuit may be interposed between the user interface circuitry and the memory controller circuitry to facilitate clock domain crossing. The memory controller interface may also include a read data decoder for decoding incoming read data retrieved from the external memory and a read ID queue that stores a read ID tag associated with the retrieved data. The memory controller circuitry may also include routing circuitry that receives memory access requests from the user interface circuitry and that routes each of the memory access requests to a selected one of the multiple color pipelines.

Each color pipeline may include a read command queue, a write command buffer, a write data buffer that stores write data, a write data encoder that encodes the stored write data, a row address strobe (RAS) arbiter that arbitrates among different memory bank accesses, and a column address strobe (CAS) arbiter that arbitrates between read and write memory access requests. The memory controller circuitry may further include a color (or master) arbiter that receives read and write memory access requests from the multiple color pipelines.

In some arrangements, the user interface may be operated in a first clock domain; the memory controller circuitry may be operated in a second clock domain that is greater than, equal to, or less than the first clock domain in terms of clocking frequency; and the PHY interface may be operated in a third clock domain that is at an integer multiple of the second clock domain in terms of clocking frequency. The integer multiple need not be a power of two. The rate matching circuit may provide synchronous or asynchronous clock domain crossing between the user interface and the memory controller circuitry.

The user interface may include user dependent blocks whose configuration depends on the core user logic. The PHY interface may include protocol agnostic blocks whose configuration remains unchanged for different memory protocols. The memory controller circuitry, in one suitable embodiment, may include memory protocol agnostic blocks and memory protocol dependent blocks (e.g., circuit blocks whose configuration and function may vary across different memory protocols). In some embodiments, the PHY interface may also include memory protocol dependent blocks. If desired, the memory protocol dependent blocks may be implemented as programmable or "soft" circuit components, whereas the memory protocol agnostic blocks may be implemented as fixed or "hardened" circuit components.

Further features of the present invention, its nature and various advantages will be more apparent from the accompanying drawings and the following detailed description.

DETAILED DESCRIPTION

Embodiments of the present invention relate to integrated circuits that contain memory interface circuitry. It will be recognized by one skilled in the art, that the present exemplary embodiments may be practiced without some or all of these specific details. In other instances, well-known operations have not been described in detail in order not to unnecessarily obscure the present embodiments.

The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments.

Figure 1:
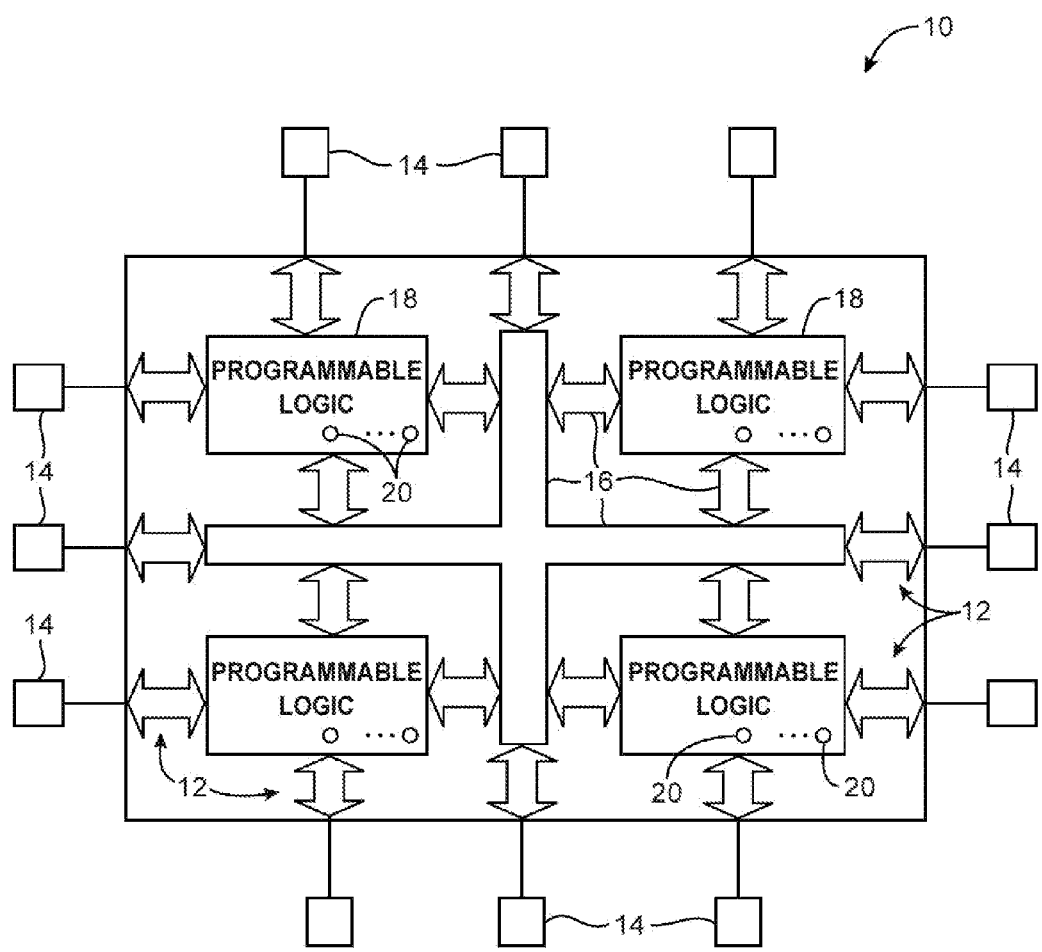
FIG. 1 is a diagram of an illustrative programmable integrated circuit in accordance with an embodiment of the present invention.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
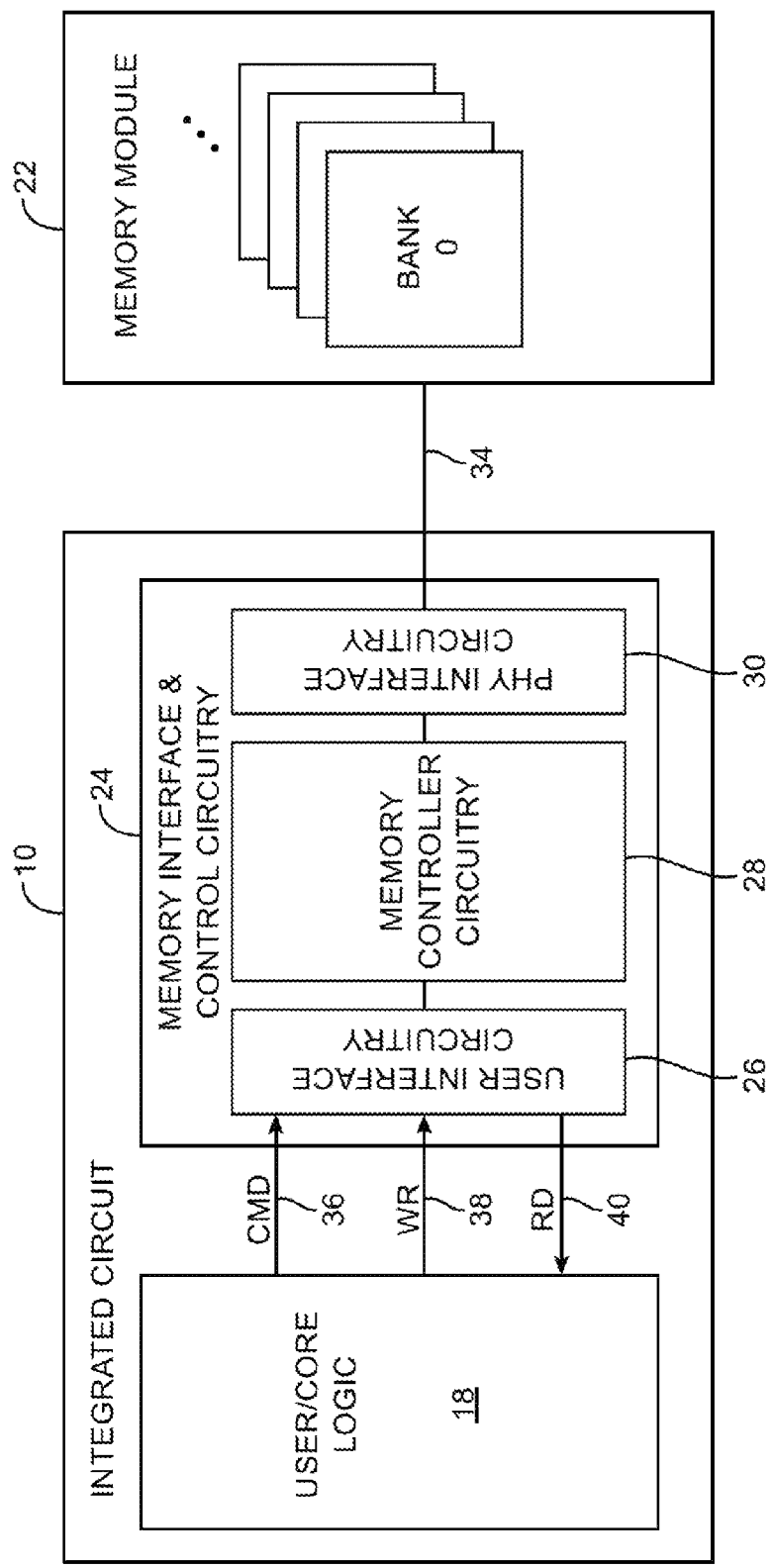
FIG. 2 is a diagram of illustrative memory interface and controller circuitry in accordance with an embodiment of the present invention.

Device 10 may communicate with off-chip memory such as memory module 22 (see, e.g., FIG. 2). Memory module 22 may be an external memory device sometimes referred to as a single in-line memory module (SIMM) or a dual in-line memory module (DIMM). Memory module 22 may include volatile memory elements organized into different banks (e.g., bank 0, bank 1, bank, 2, and so on). The different memory banks can also be grouped into one or more ranks. Device 10 may be configured to communicate with at least two memory modules 22, at least four memory modules 22, etc. As shown in FIG. 2, device 10 may include memory interface and control circuitry 24 that serves to relay information between memory module 22 and user logic circuits 18 that are internal to device 10. User logic 18 may sometimes be referred to as "core" logic.

Memory interface circuitry 24 may include user interface circuitry 26, memory controller circuitry 28, and PHY interface circuitry 30. The PHY interface 30 may serve as a physical layer input-output device (i.e., a component that physically drives signals off of device 10 to memory module 22 and receives signals from memory module 22). Circuitry 26 may be used to interface with user logic 18. For example, circuitry 26 may directly receive from user logic 18 memory access commands via path 36. Depending on the type of command being issued, circuitry 24 may be used to perform a memory write or read operation.

During memory write operations, user logic 18 may provide write data signals to user interface 26 via path 38. The write data signals and associated data strobe, clock, and address signals may be processed by memory controller 28 and output to memory module 22 via PHY interface 30 over path 34. The address signals may serve to specify the address (e.g., a selected bank address in memory device 22) to which data is written during write operations and the address from which data is read out during read operations. During memory read operations, data retrieved from memory module 22 may be conveyed from memory module 22 to PHY interface 30 via path 34. Memory controller 28 may process the read back and may forward the read data to core logic 18 via user interface 26 over return path 40.

Memory interface and control circuitry 24 may also serve to perform desired data rate conversions and to generate signals that meet timing requirements specified by the memory protocol currently under use. The arrangement of FIG. 2 is merely illustrative and is not intended to limit the scope of the present invention. Integrated circuits other than programmable integrated circuits may include memory interface circuitry 24 that is used to communicate with one or more memory modules 22. If desired, memory interface circuitry 24 may be implemented as an external controller to device 10 as a separate standalone memory interface device.

Conventional memory interface and controller circuitry are either implemented as "soft" memory controllers (i.e., memory controllers that can be reconfigured or reprogrammed depending on the current needs of the user) or "hard" memory controllers (i.e., memory controllers that are fixed and cannot be reconfigured or reprogrammed). Hardened memory controllers can help push memory operation to a higher frequency than the frequency that the core user logic can support, but this approach limits the device by disallowing users to creatively incorporate additional proprietary IP (intellectual property) blocks into the memory controller. Significant challenges may also arise when the hardened memory controller has to be updated to support different memory protocols/topologies. Soft memory controllers, on the other hand, offers more flexibility in supporting different memory protocols but does not offer the same memory scheduling efficiency and performance as hardened memory controllers due to tight logic dependencies.

Embodiments of the present invention relate to an improved memory controller architecture that partitions the memory controller into commonly used blocks (e.g., memory protocol agnostic blocks), memory protocol dependent blocks (e.g., blocks that are customized based on the current protocol of interest), and user dependent blocks (e.g., blocks that are customized based on the current application).

Figure 3:
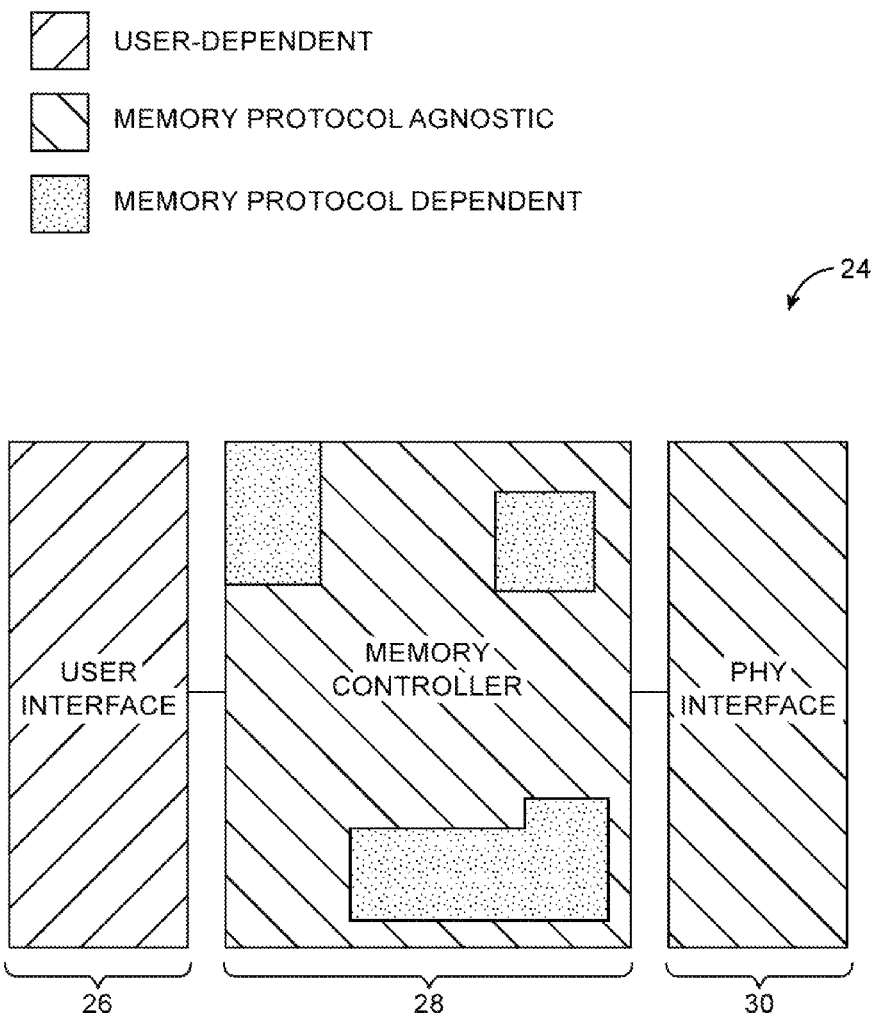
FIG. 3 is a diagram showing how the memory interface and controller circuitry of FIG. 2 can be organized into at least three different types of blocks in accordance with an embodiment of the present invention.

FIG. 3 shows one suitable way of partitioning memory interface and control circuitry 24. As shown in FIG. 3, user interface 26 may include user-dependent blocks that are not part of any specific memory protocol but is application specific. As examples, user interface 26 may be configured to support virtual memory address mapping in one scenario or may be configured to support atomic "smart" memory operations in another scenario. The physical interface 30 may include primarily protocol agnostic blocks that are a common basis to most (if not all) memory protocols (e.g., the design and configuration of physical interface 30 should not change among different memory protocols/topologies). If desired, physical interface 30 may also include memory protocol dependent blocks. Memory controller 28 may include a mix of protocol agnostic blocks capable of servicing basic read and write operations and protocol dependent blocks whose function may depend on the particular memory protocol that is being supported (such as blocks for supporting bank and sideband management).

The partition in the example of FIG. 3 is merely illustrative. In general, each of circuitries 26, 28, and 30 may include one or more different types of blocks. For example, user interface 26 may include user-dependent blocks and memory protocol agnostic blocks. As another example, PHY interface 30 may include memory protocol agnostic blocks and memory protocol dependent blocks. As yet another example, memory controller 28 may include protocol agnostic blocks, protocol dependent blocks, and user-dependent blocks.

Figure 4:
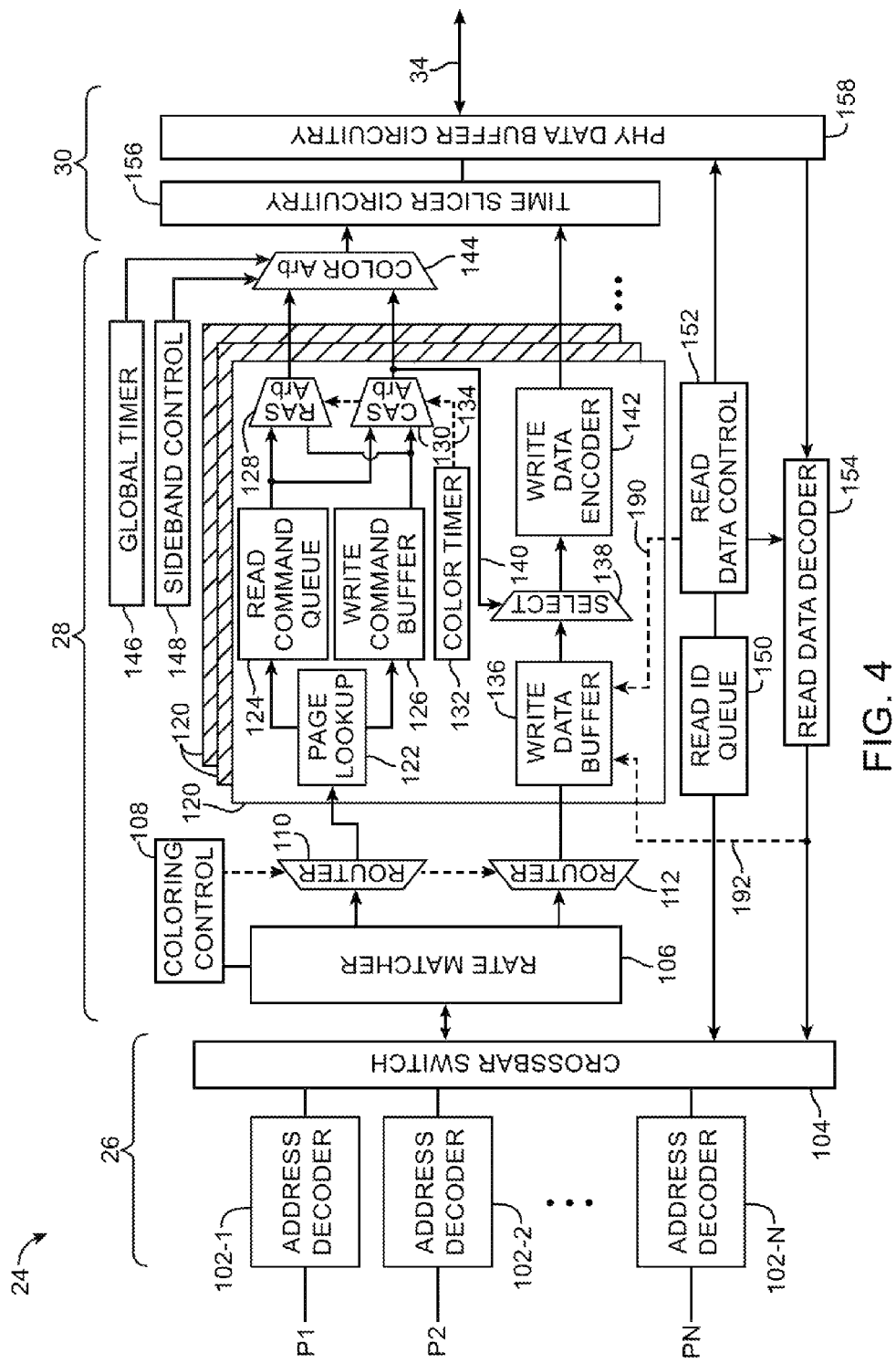
FIG. 4 is a diagram showing one illustrative implementation of memory interface and controller circuitry of the type shown in FIG. 2 in accordance with an embodiment of the present invention.

FIG. 4 shows one suitable memory architecture implementation of circuitry 24 that allows for the exemplary partitioning of blocks described in connection with FIG. 3. As shown in FIG. 4, user interface 26 may include multiple address decoders 102 (e.g., address decoders 102-1, 102-2, . . . , and 102-N) and a crossbar switch 104. First address decoder 102-1 may be coupled to a first memory port P1; second address decoder 102-2 may be coupled to a second memory port P2; . . . ; and address decoder 102-N may be coupled to an N-th memory port PN. Each of the memory ports P1-PN interfaces with the core user logic and can be duplicated to provide the desired memory controller bandwidth.

The address decoders 102 decodes any addresses arriving from the core logic (e.g., to decode incoming addresses that have been encoded according to the particular user application) into addresses that can be recognized by the specific memory protocol being supported. Interface 26 may also include application specific manipulation soft logic circuitry (not shown) that can be customized to support memory address mapping, generation of smart memory functions like atomic read-modify-write cycles, and/or other desired functions. Crossbar switch 104 may be an optional block that can be used to reroute memory access requests from the different memory ports that are not targeting local memory banks.

Still referring to FIG. 4, memory controller 28 may include a rate matching circuit 106, a coloring control circuit 108, routers 110 and 112, one or more instances of a color pipeline 120, a color arbiter 144, a global timer 146, a sideband controller 148, a read ID queue 150, a read data control circuit 152, and a read data decoder 154. Rate matcher 106 may serve as a command piping stage (e.g., a first-in first-out circuit) that allows for synchronous or asynchronous crossings between the core clock domain (e.g., a first clock domain in which circuitry 26 is operated) and the memory controller clock domain (e.g., a second clock domain in which circuitry 28 is operated and is assumed to be different than the first clock domain if a rate matcher is present). The use of rate matcher 106 allows for the memory controller operation to be independent from the core logic. In general, rate matcher 106 may be configured to support a slow-to-fast clock domain crossing or a fast-to-slow clock domain crossing for maximum flexibility.

Coloring control circuit 108 may be used to assign a color to each memory cycle dispatched from rate matcher 106. The term "color" may refer to an assignment of a particular pipelined thread in one or more parallel threads for processing a command that accesses a particular rank/bank in memory module 22 (FIG. 2). As described previously, one or more multiple color pipelines 120 can be duplicated to support a multi-threaded memory scheduling scheme. Once a particular rank/bank of memory is assigned a given color, all cycles accessing that rank/bank is assigned the same color. Color assignments for a given rank/bank can change once all pending cycles accessing that particular rank/bank has been processed and once the opened page is closed.

It is generally desirable to evenly distribute the rank/bank combinations among the different available colors to ensure better parallelism and scheduling efficiency. Coloring control circuit 108 may generate control signals that control routing circuits 110 and 112 to pass command/addressing information and write data, respectively, to a selected one of the multiple color pipelines 120.

Each color pipeline 120 may include a page status lookup circuit 122, a read command queue (RCQ) 124, a write command buffer (WCB) 126, a row address strobe (RAS) arbiter 128, a column address strobe (CAS) arbiter, a color timer 132, a write data buffer 136, a write data selector 138, and a write data encoding circuit 142. Page status lookup circuit 122 may serve to compare an incoming memory cycle with pending memory cycles can be used to look up the page information for the newly received command as well as enforcing command (re)ordering. The term "page" may refer to an opened row in a particular bank of memory. In particular, the contents of the opened row is typically copied and stored to a temporary buffer. For example, the newly dispatched cycle (i.e., command) from rate matcher 106 may be checked against the current rank/bank page status to determine whether the newly dispatched cycle is accessing a page. If the new cycle is accessing an active page, that cycle may be scheduled out of order before other pending access requests in the RCQ or the WCB.

If desired, the incoming cycles may also be checked against the pending cycles in the RCQ and the WCB for possible hits to detect ordering conflicts (e.g., to perform dependency lookup). As an example, read cycles hitting an entry in write command buffer 126 may elevate the priority of that entry to high priority. As another example, write cycles hitting an entry in read command queue 124 may set that entry to high priority. As yet another example, write cycles hitting an entry in write command buffer 126 may be merged into the same entry (e.g., to perform a partial write merger). Commands having elevated priority levels may be flushed to external memory 22.

If no conflicts are detected, the incoming cycle may be "retired" in either the RCQ or the WCB (e.g., an incoming read command may be routed to read command queue 124, whereas an incoming write command may be routed to write command buffer 126). Once retired, the memory cycle is considered to be globally ordered from a systems point of view whether or not it has been physically dispatched to the external memory. Each entry in RCQ 124 and WCB 126 should be responsible for managing its own page status via lookup circuit 122 and also monitoring all granted "activate" requests (e.g., a command to open a page) and "pre-charge" requests (e.g., a command to close a page) for its bank as part of its page status management.

Read command queue 124 may include a finite state machine that tracks the state of each command and that updates the state of each command based on grants from arbiters 128 and 130. In one suitable arrangement, read command queue 124 may be implemented as a shift register to maintain the age status of each command to help simplify read/write command arbitration.

Write command buffer 126 can be used to hold full write commands, partial write commands, and read-modify-write (RMW) commands. Write command buffer 126 may also include a finite state machine that tracks the stack of each write request and that updates the state of each request based on grants from the RAS/CAS arbiter. In one suitable arrangement, write command buffer 126 may be implemented as a simple buffer that is capable of handling partial write mergers into a single entry and generating additional read requests for read-modify-writes.

RAS arbiter 128 may serve to perform bank management arbitration (e.g., to manage and monitor activate and pre-charge commands that "opens" or "closes" a selected row in each memory bank), whereas CAS arbiter 130 may serve to perform arbitration between read and write requests. The RAS and CAS arbiters may be controlled by color timer 132 via control path 134. Color timer 132 can help manage timing and page information for each colored bank.

Write data buffer 136 may be used to store write data corresponding to the entries in write command buffer 126 (e.g., write data buffer 136 may receive write data from router 112). Write data encoder 142 (if enabled) may be used to perform error-correcting code (ECC) encoding, cyclic redundancy check (CRC), data bus inversion, and other data processing operations on the write data. Write command selection circuit 138 may be interposed between write data buffer 136 and write data encoder 142 and may be used (during out-of-order scheduling) to select the right set of data corresponding to a write command that was dispatched out of order to the external memory. The encoded data can then be fed to PHY interface 30 along with the associated write request. If desired, data parity computation circuitry and data path alignment circuitry (not shown) can be included to calculate the parity of the write data and to realign the write data path signals (e.g., write data and any associated data mask, check bits and parity bits) based on the memory protocol being supported, respectively.

When executing a read request, read data may be provided from memory 22 back to memory controller 28. Read data control circuit 152 may control the read data draining from PHY interface 30. Read data decoder 154 may be used to perform ECC decoding operations to correct the read data (if correctable), to report any ECC errors (if detected), to decode CRC bits, to perform data bus inversion, etc. If desired, data parity check circuitry and data filter circuitry (not shown) can be included to check the read data parity (if enabled) and to filter out any garbage data from the read data stream, respectively. Read data control 152 and read data decoder may have outputs that are coupled to write data buffer via paths 190 and 192, respectively, to facilitate data merging during read-modify-write operations.

For read commands that are scheduled out of order, the corresponding read data will be returned out of order. If desired, additional application-specific logic (not shown) can be used to reorder the data that is being returned to the user logic. When the memory controller reorders the read commands and when the data is presented back from the PHY interface, the requester needs to know which read data is being returned. Read ID queue 150 may be used to tag each read return data. For example, each read command may be assigned a read ID prior to being placed in RCQ 124. If that read command is dispatched out of order to the external memory, the read ID associated with that out-of-order read command is placed in read ID queue 150. When the read data is returned by the external memory, the correct read ID is popped out of the read ID queue 150 to tag the returned read data. By analyzing the tagging information, any reordering logic can be used to reorder the return data in the order that the commands are received, if desired.

As described above, the exemplary architecture of FIG. 4 uses cycle coloring as means for distributing memory access requests among different color pipelines 120 for arbitration. The RAS and CAS arbiters in each color pipeline 120 should only be responsible for arbitrating memory access request assigned for that color. Since memory read cycles within read command queue 124 is already age aware, a simple first-available arbitration from the lowest entry for any request from RCQ 124 suffices to identify the "oldest" qualifying request. Similarly, since memory write cycles within write command buffer 126 is globally ordered and is not required to return data, a simple first-available arbitration from the lowest entry for any request from WCB 126 also suffices. If desired, the arbitration to grant write request from the write command buffer may also be opportunistic as the memory write cycles within the WCB is already globally ordered.

One suitable arbitration policy for handling requests for a given color is as follows (in descending priority):
(1) High priority read requests from RCQ
(2) High priority read/write requests from WCB
(3) High priority activate/pre-charge requests from RCQ
(4) High priority activate/pre-charge requests from WCB
(5) Read requests from RCQ
(6) Activate/pre-charge requests from RCQ
(7) Activate/pre-charge requests from WCB
(8) Read/write requests from WCB Since the RAS/CAS arbiters within each color pipeline 120 only arbitrates requests from the same rank or bank, there should be little or no dependence across the different color pipelines for memory timing updates. This allows for each color pipeline 120 to manage its own set of resources, allowing for true parallel arbitration.

RAS arbiter 128 and CAS arbiter 130 may output requests to color arbiter 144 (sometimes referred to as a "master" arbiter). Color arbiter 144 will only process requests from the "winner" of the RAS and CAS arbiters from each color pipeline (e.g., color arbiter 144 will process the request with higher priority). The color arbitration performed using arbiter 144 may also be based on the memory protocol to be supported and also to filter out cross-color arbitration dependencies. To support parallel processing for both RAS and CAS paths, a separate RAS and CAS arbitration may be implemented as follows:

Master arbiter policy for RAS:
(1) High priority activate/pre-charge requests from RCQ
(2) High priority activate/pre-charge requests from WCB
(3) Activate/pre-charge requests from RCQ
(4) Activate/pre-charge requests from WCB Master arbiter policy for CAS:
(1) High priority read requests from RCQ
(2) High priority read/write requests from WCB
(3) Read requests from RCQ
(4) Write requests from WCB Global timer 146 may, for example, be used to govern the timing for cross-bank cycles and/or other global timing parameters such as tFAW (four activate window), tRRD (activate to activate delay), etc. Sideband control circuit 148 may be used to control various sideband accesses to the external memory such as performing memory refreshes, placing the memory controller in power savings mode, in test modes, etc. If desired, color arbiter 144 may select candidate request from different color pipelines based on different assigned weights. In general, color arbiter 144 may be configured to perform any type of request arbitration to maximize memory bandwidth.

As described previously, memory controller 28 may include multiple duplicate color pipelines 120 to allow for the memory controller clock domain to operate at a lower frequency compared to the clock domain of the PHY interface while maintaining satisfactory out-of-order memory scheduling efficiency.

Color arbiter 144 may feed requests to time slicer circuitry 156 that is part of PHY interface 30. Time slicer circuitry 156 may be responsible for channeling each respective color arbiter granted cycle into an appropriate slot within a slice frequency in the PHY clock domain (e.g., circuitry 156 may receive and process memory access requests from the color arbiter in a time multiplexed fashion). The time or frequency slicer operates at an integer frequency multiple of the memory clock domain, where the value of the integer multiple determines the number of color pipelines in the memory controller. This is true when a command is sustained every clock cycle. In scenarios in which it is not necessarily to sustain a command every clock cycle, the number of color pipelines in the memory controller may be less than the integer multiple. Time slicer 156 may also be used to ensure fairness among the different colors and may send granted cycle information to page lookup 122, color timer 132, and the RCQ/WCB for updates. PHY interface 30 may also include data buffer circuitry 158 for buffering information conveyed between time slicer 156 and output path 34.

Figure 5:
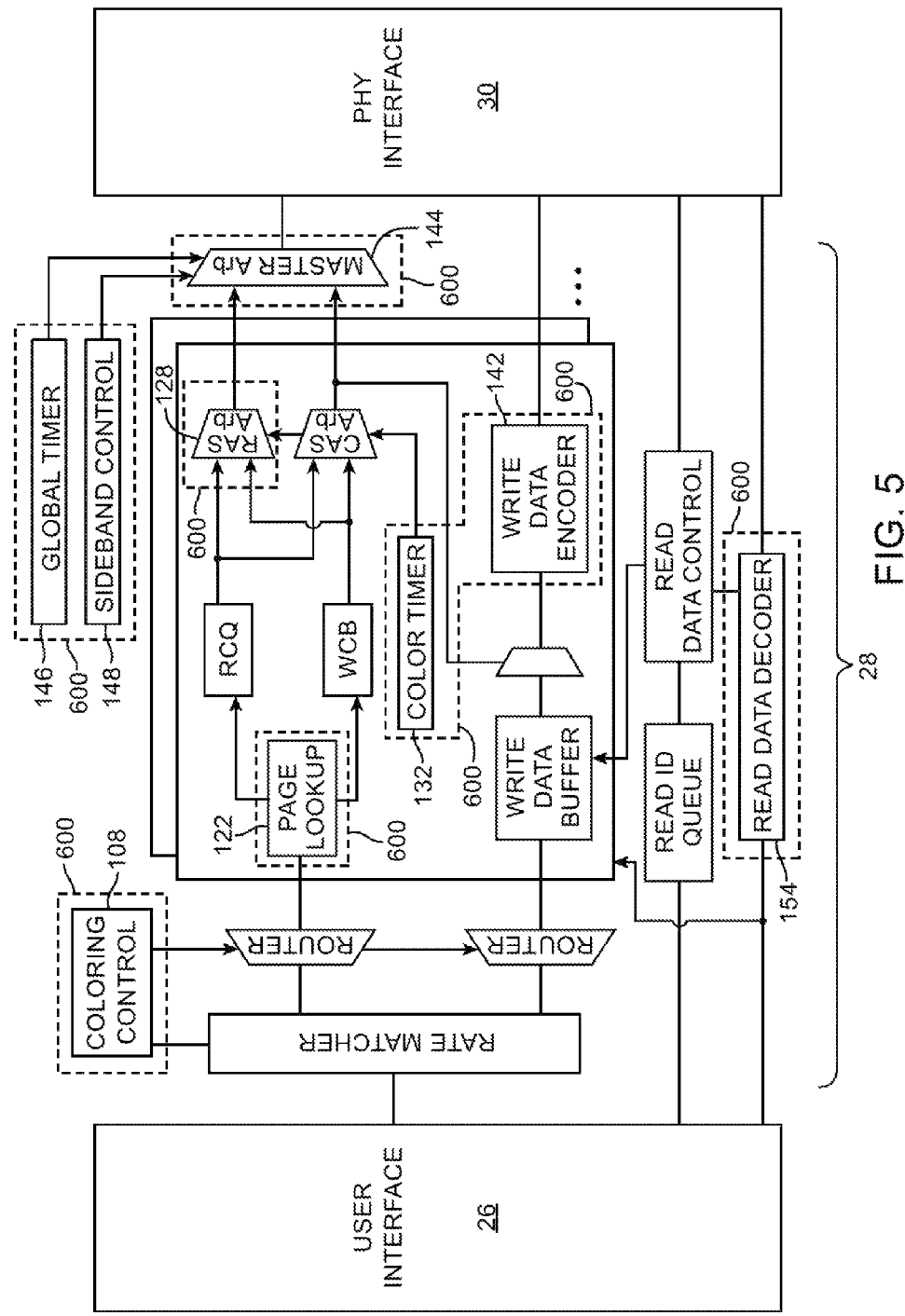
FIG. 5 is a diagram showing how the memory controller circuitry of FIG. 4 can be organized into memory protocol agnostic blocks and memory protocol dependent blocks in accordance with an embodiment of the present invention.

As described above in connection with FIG. 3, the illustrative memory architecture of FIG. 4 may allow partitioning of the memory controller into memory protocol agnostic blocks and memory protocol dependent blocks. FIG. 5 shows one way of partitioning memory controller 28. As shown in FIG. 5, blocks 600 (e.g., coloring control circuit 108, page lookup circuit 122, global timer 146, sideband controller 148, color timer 132, RAS arbiter 128, master arbiter 144, write data encoder 142, and read data decoder 154) may be considered memory protocol dependent blocks whose function and operation may vary according to the memory protocol currently being implemented while other circuits in controller 28 may be considered memory protocol agnostic blocks whose function and operation should remain the same regardless of the memory protocol currently being supported. Partitioned in this way, only a small portion of controller 28 needs to be updated when shifting from one memory protocol/topology to another. This is merely illustrative. If desired, other ways of partitioning memory controller 28 into different types of blocks (e.g., memory protocol agnostic blocks, memory protocol dependent blocks, user dependent blocks, etc.) can be employed.

Figure 6:
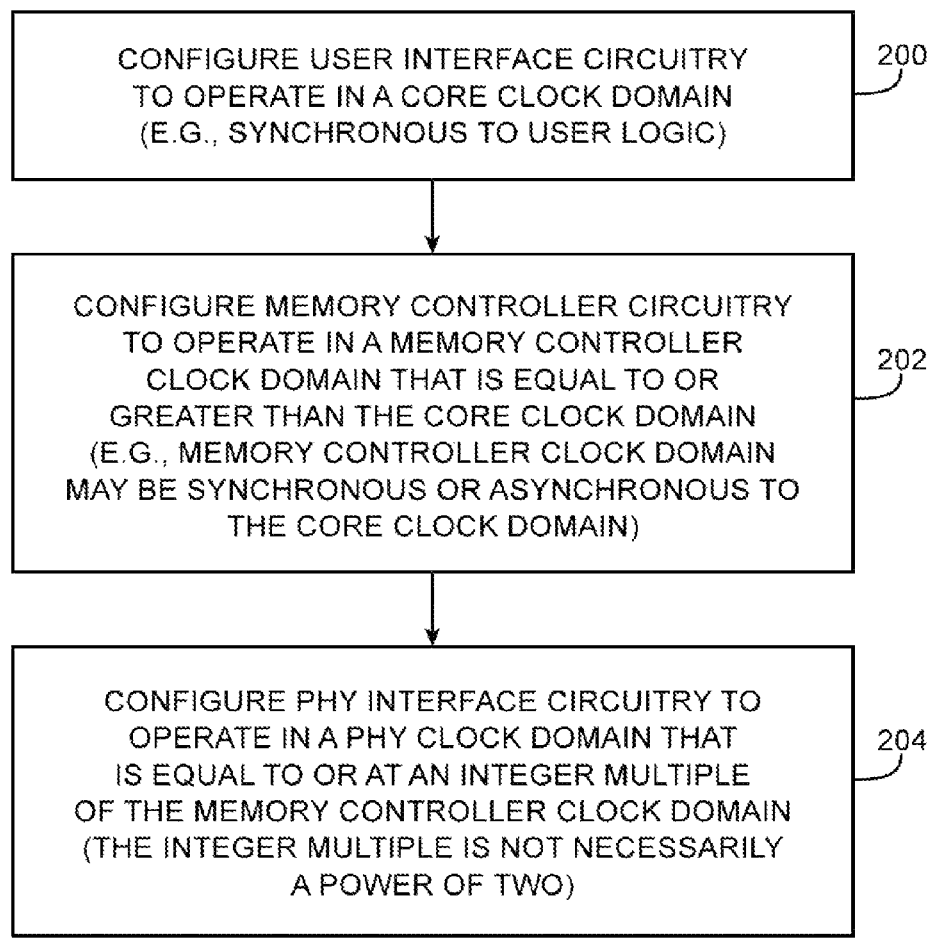
FIG. 6 is a flow chart of illustrative steps for configuring the memory interface and controller circuitry of FIG. 4 to operating in three different clock domains in accordance with an embodiment of the present invention.

The exemplary memory interface and controller architecture of FIG. 4 may also support the partitioning into three operating clock domains. FIG. 6 shows steps involved in configuring circuitry 24 to operating in three different clock domains. User interface 26 may be configured to operate in a core clock domain that synchronous to the user logic (step 200). Memory controller 28 may be configured to operate in a memory controller clock domain that is less than, equal to, or greater than the core clock domain. The memory controller clock domain may be synchronous or asynchronous to the core clock domain. The physical input-output interface 30 may be configured to operate in a PHY clock domain that is equal to or at an integer multiple of the memory controller clock domain (e.g., step 204, circuit blocks in PHY 30 may be controlled by a clock signal having a clock rate that is equal to an integer multiple of that of the clock signal controlling circuit blocks in controller 28). The integer multiple may determine the number of colors or color pipelines 120 in the memory controller and need not be a power of two (e.g., the integer multiple may be equal to one, two, three, four, five, six, eight, ten, sixteen, twenty, etc.).

The use of three separate clocking domains may provide flexibility to the user to independent clock the user interface 26 at a lower frequency that is supported by the core user logic fabric 18 (FIG. 2) while allowing memory controller 28 to operate at a higher frequency to reduce the latency within the memory controller. This also allows for better scalability of the memory controller architecture to a soft implementation, a hard implementation, or a hybrid (e.g., soft and hard) implementation.

As an example, an 800 MHz DDR3 configuration may be implemented using a fully soft solution via use of a core clock domain at 200 MHz (synchronous to the memory controller clock domain), a memory controller clock domain at 200 MHz with variable depth RCQ and WCB, and a PHY clock domain at 400 Hz with half-rate registers (e.g., registers that respond and latch at both rising and falling clock edges) and two arbitration colors. The 800 MHz DDR3 configuration may also be implemented using a fully soft solution via use a core clock domain at 125 MHz (asynchronous to the memory controller clock domain), a memory controller clock domain at 200 MHz with variable depth RCQ and WCB, and a PHY clock domain at 400 Hz with half-rate registers but only one arbitration color. A single arbitration color reduces resource utilization at the cost of degraded scheduling efficiency.

As another example, an 800 MHz DDR3 configuration may also be implemented using a fully hardened solution via use of a core clock domain at 200 MHz (synchronous to the memory controller clock domain), a memory controller clock domain at 400 MHz with fixed depth RCQ and WCB, and a PHY clock domain at 800 Hz with full-rate registers (e.g., registers that respond and latch at only the rising or falling clock edges) and two arbitration colors. As yet another example, an 1600 MHz DDR4 configuration may be implemented using a hybrid solution via use of a core clock domain at 200 MHz (synchronous to the memory controller clock domain), a memory controller clock domain at 200 MHz with selective hardening of protocol agnostic blocks (e.g., fixed depth RCQ and WCB), and a PHY clock domain at 800 Hz with half-rate registers and four arbitration colors.

In general, any portion of the memory protocol agnostic blocks can be selectively hardened while at least some portion of the memory protocol dependent blocks should be programmable. The user-dependent blocks can be hardened or soft depending on the desired flexibility of the user. The illustrative memory controller architecture of FIG. 4 allows for application specific memory manipulation circuitry to be attached seamlessly and allows for soft solutions (e.g., to support lower-end products with lower performance requirements and smaller resource utilization), hard solutions (e.g., to support higher-end products with higher performance requirements and larger resource utilization), or hybrid (combination of soft and selected hardened of sub-blocks) solutions, which can help simply logic design, reduce device resource utilization, increase out-of-order scheduling efficiency, and allow for pipeline additions.

Figure 7:
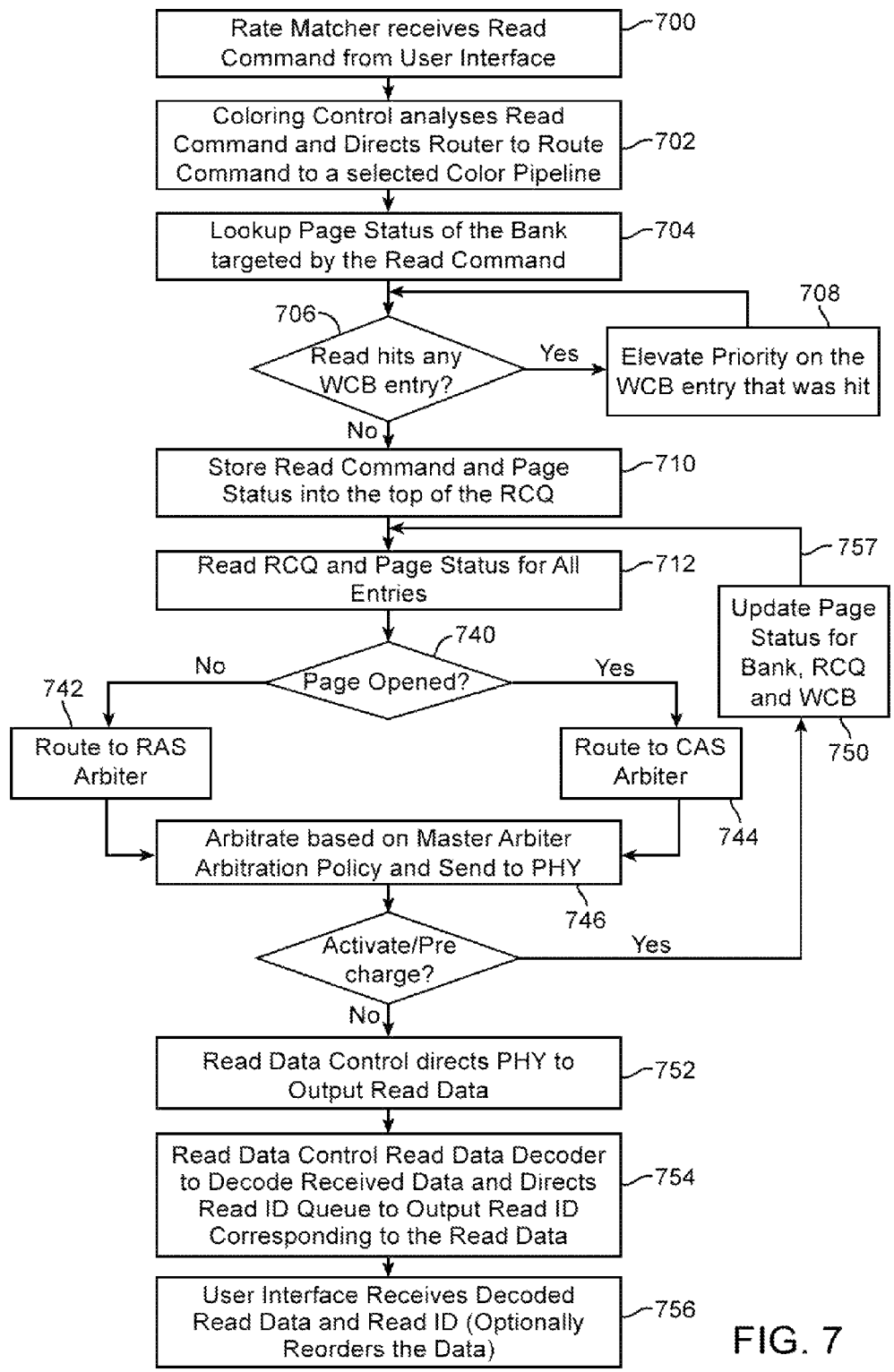
FIG. 7 is a flow chart of illustrative steps for processing a read command using the memory interface and controller circuitry of FIG. 4 in accordance with an embodiment of the present invention.

FIG. 7 is a flow chart of illustrative steps involved in processing read command using a memory controller of the type described in connection with FIG. 4. At step 700, rate matcher 106 may receive an incoming read command from user logic 26. At step 702, coloring control circuit 108 may analyze the read command and direct router 110 to route the read command to a selected color pipeline 120. At step 704, page lookup circuit 122 may look up the status of the bank that is targeted by the incoming read command.

At step 706, the incoming read command may be checked with each entry in WCB 126 to determine whether the current read command hits any entries in WCB 126 (e.g., to determine whether the new read command is targeting the same page within a particular rank/bank). If a hit is detected, that entry in the WCB is elevated to high priority (step 708). If no hit is detected, processing may proceed to step 710.

At step 710, the read command and its corresponding page status information may be stored into RCQ 124. At step 712, all the entries in RCQ 124 and the associated page status may be read.

At step 740, the page status for the current read command may be checked. If the page is opened, the command may be routed to CAS arbiter 130 (step 744). If the page is closed, the command may be routed to RAS arbiter 128 (step 742). At step 746, commands from the CAS and RAS arbiters may be arbitrated based on the master arbiter arbitration policy described above and may be sent to PHY interface 30.

At this point, if an activate or pre-charge operation is performed, then the page status for the bank, RCQ, and WCB will need to be updated to reflect the change (step 750). Processing may then loop back to step 712, as indicated by path 757. If no activate/pre-charge operation is performed, read data control 152 may be used to direct PHY 30 to output read data after a fixed number of cycles which is a function of the memory module's read latency (step 752).

At step 754, read data control 152 may direct read data decoder 154 to decode the read data received from the PHY interface and may also direct read ID queue 150 to output the read ID corresponding to the received read data. At step 756, the decoded read data and the associated read ID may be fed to user interface 26. The data that is being returned to the user interface can be optionally reordered, if desired.

Figure 8:
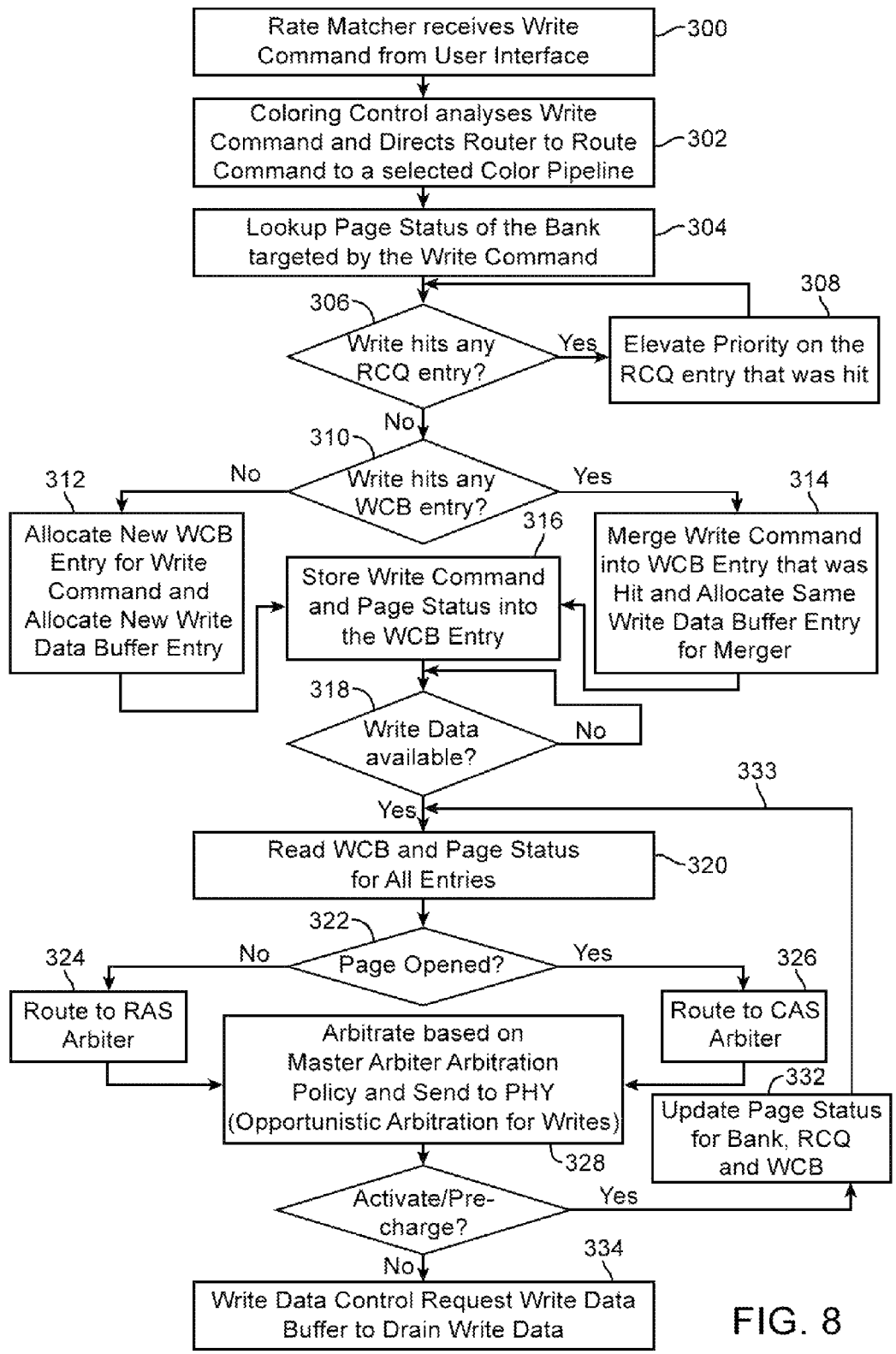
FIG. 8 is a flow chart of illustrative steps for processing a write command using the memory interface and controller circuitry of FIG. 4 in accordance with an embodiment of the present invention.

FIG. 8 is a flow chart of illustrative steps for handling a write command using a memory controller of the type shown in FIG. 4. At step 300, rate matcher 106 may receive a write command from user logic 26. At step 302, coloring control circuit 108 may analyze the write command and direct router 110 to route the write command to a selected color pipeline 120. At step 304, page lookup circuit 122 may look up the status of the bank that is targeted by the incoming write command.

At step 306, the incoming write command may be checked with each entry in RCQ 124 to determine whether the current write command hits any entries in RCQ 124 (e.g., to determine whether the new write command is targeting the same page within the same rank/bank). If a hit is detected, that entry in the RCQ is elevated to high priority (step 308). Elevating entries in the RCQ in this way enables the conflicting read to be flushed out of the RCQ before the new write command is executed. If desired, the new write command may be stalled at the inlet of the WCB until the conflicting read is flushed out of the RCQ. If no hit is detected, processing may proceed to step 310.

At step 310, the incoming write command may be checked with each entry in WCB 126 to determine whether the current write hits any entries in WCB 126. If there are no hits, the write command is allocated to a new entry in WCB 126 and the corresponding write data is allocated to a new entry in write data buffer 136 (step 312). If a hit is detected, the new write command may be merged with the previously stored entry in the WCB while the corresponding write data is allocated to the same write data buffer entry for merging (step 314). At step 316, the write command and associated page status may be stored in the desired WCB entry.

At step 318, write data buffer 136 may be checked to determine whether any write data is available for writing. If write data is not yet available in the write data buffer, processing may be temporarily suspended until write data is available. When write data is available, all entries in WCB 126 and the associated page status may be read (step 320).

At step 322, the page status for the current write command may be checked. If the page is opened, the command may be routed to CAS arbiter 130 (step 326). If the page is closed, the command may be routed to RAS arbiter 128 (step 324). At step 328, commands from the CAS and RAS arbiters may be arbitrated based on the master arbiter arbitration policy described above and may be opportunistically sent to PHY interface 30.

At this point, if an activate or pre-charge operation is performed, then the page status for the bank, RCQ, and WCB will need to be updated to reflect the change (step 332). Processing may then loop back to step 320, as indicated by path 333. If no activate/pre-charge operation is performed, write data buffer 136 may proceed to drain write data (step 334).

Figure 9:
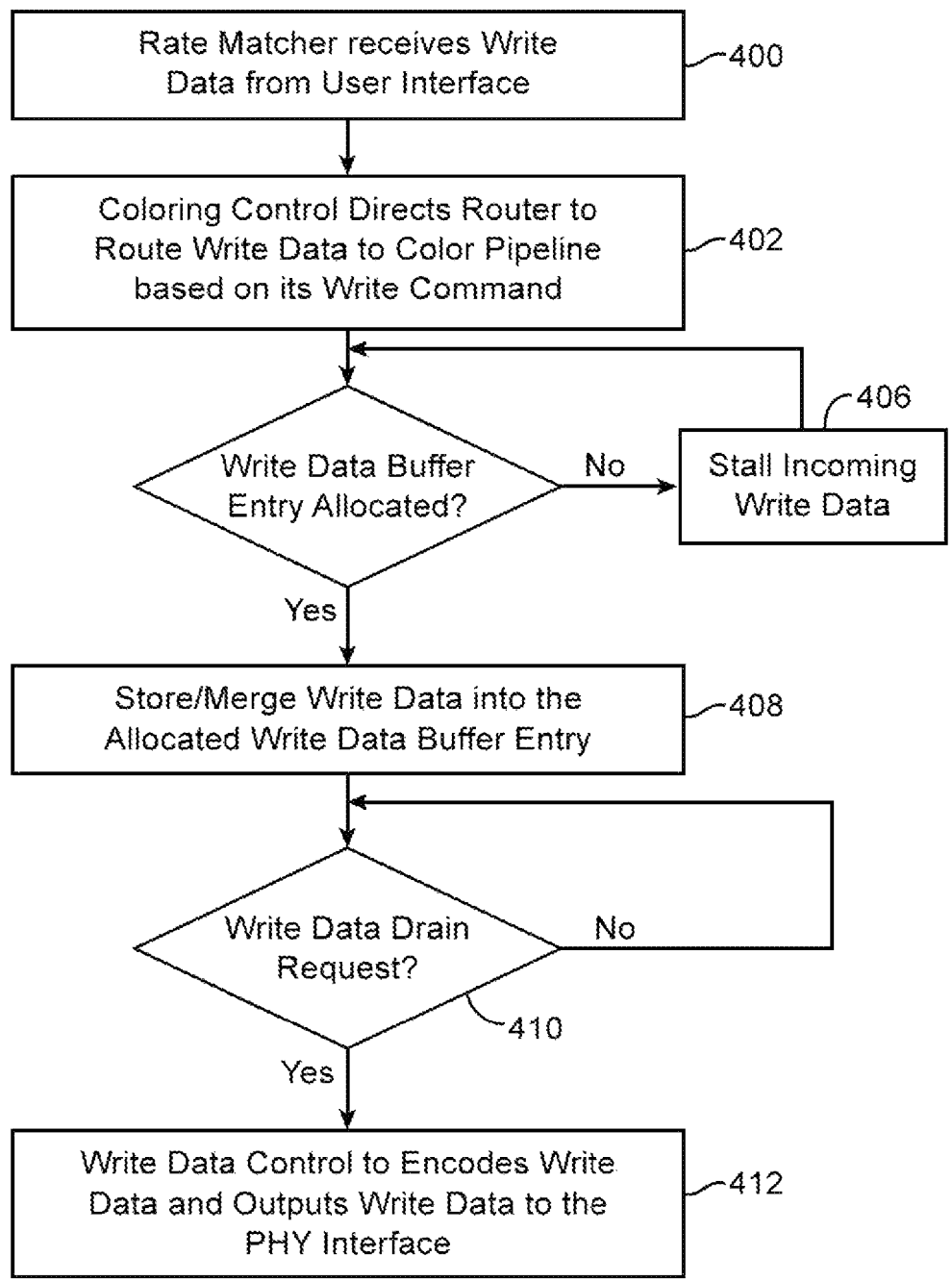
FIG. 9 is a flow chart of illustrative steps for processing write data using the memory interface and controller circuitry of FIG. 4 in accordance with an embodiment of the present invention.

FIG. 9 is a flow chart of illustrative steps for processing the write data. At step 400, rate matcher 106 may receive write data from user logic 26. At step 402, coloring control circuit 108 may direct router 112 to route the write data to a selected color pipeline 120 based on where the associated write command is being routed.

If an entry in the write data buffer 136 has not yet been allocated for the new write data, the incoming write data may be temporarily stalled (step 406). If an entry has been allocated for the incoming write data, the incoming write data may be stored/merged into the allocated write data buffer entry (step 408).

At step 410, a request to drain the write data buffer may be monitored. Once this request has been detected, write data encoder 142 encodes the selected write data and outputs the encoded write data to the PHY interface (step 412).

Figure 10:
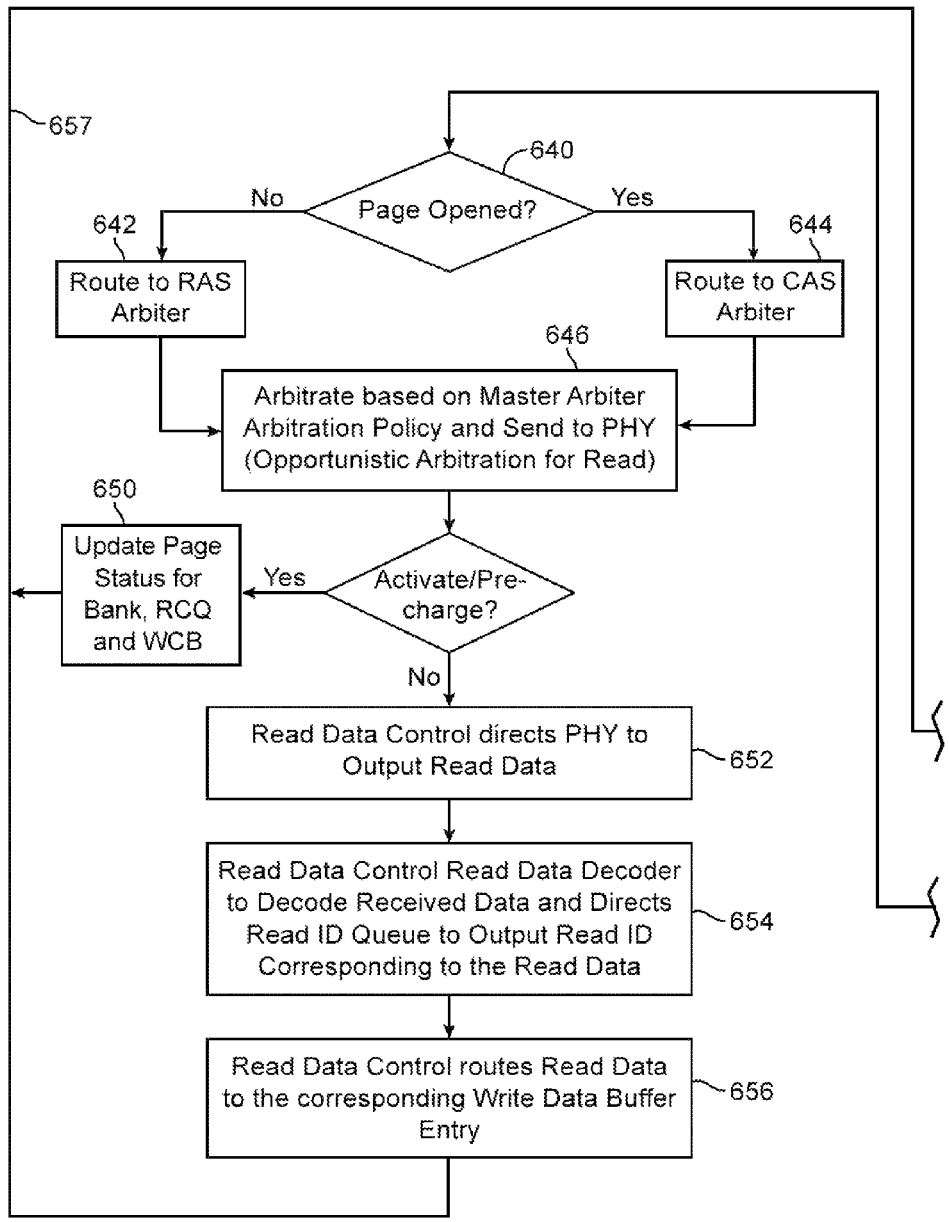
FIG. 10 is a flow chart of illustrative steps for processing a read-modify-write command using the memory interface and controller circuitry of FIG. 4 in accordance with an embodiment of the present invention.
Figure 10:
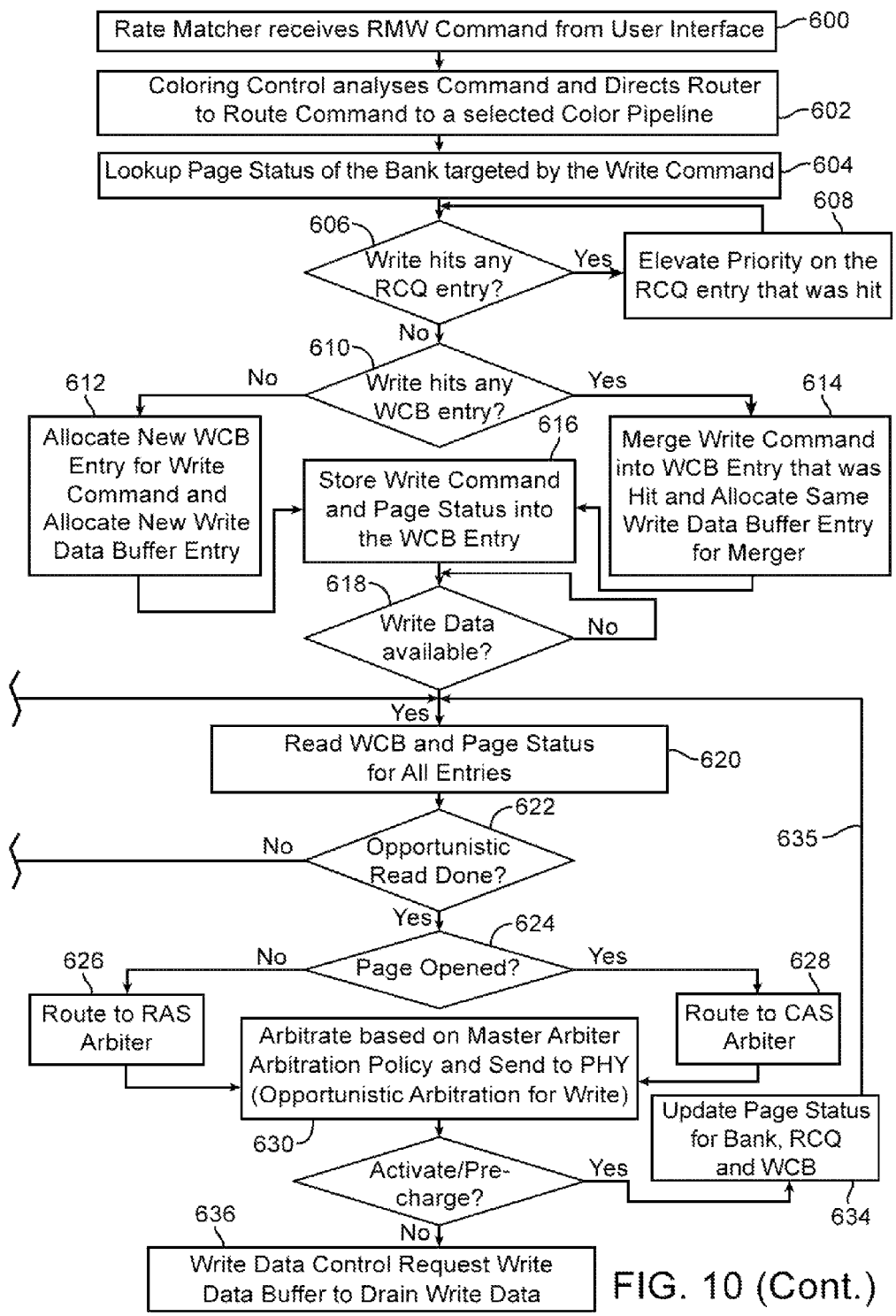

FIG. 10 is a flow chart of illustrative steps involved in processing a read-modify-write (RMW) command (e.g., a partial write command) using a memory controller of the type described in connection with FIG. 4. At step 600, rate matcher 106 may receive an incoming RMW command from user logic 26. At step 602, coloring control circuit 108 may analyze the RMW command and direct router 110 to route the RMW command to a selected color pipeline 120. At step 604, page lookup circuit 122 may look up the status of the bank that is targeted by the incoming write command.

At step 606, the incoming write command may be checked with each entry in RCQ 124 to determine whether the current write command hits any entries in RCQ 124 (e.g., to determine whether the new write command is targeting the same page within the same rank/bank). If a hit is detected, that entry in the RCQ is elevated to high priority (step 608). If no hit is detected, processing may proceed to step 610.

At step 610, the incoming RMW command may be checked with each entry in WCB 126 to determine whether the current write hits any entries in WCB 126. If there are no hits, the write command is allocated to a new entry in WCB 126 and the corresponding write data is allocated to a new entry in write data buffer 136 (step 612). If a hit is detected, the new write command may be merged with the previously stored entry in the WCB while the corresponding write data is allocated to the same write data buffer entry for merging (step 614). At step 616, the write command and associated page status may be stored in the desired WCB entry.

At step 618, write data buffer 136 may be checked to determine whether any write data is available for writing. If write data is not yet available in the write data buffer, processing may be temporarily suspended until write data is available. When write data is available, all the entries in WCB 126 and the associated page status may be read (step 620).

At step 622, the status of an opportunistic read (e.g., an additional read operation that is inserted for a read-modify-write) may be checked. If the opportunistic read has not yet been done, processing may proceed to step 640.

At step 640, the page status for the current write command may be checked. If the page is opened, the command may be routed to CAS arbiter 130 (step 644). If the page is closed, the command may be routed to RAS arbiter 128 (step 642).

At step 646, commands from the CAS and RAS arbiters may be arbitrated based on the master arbiter arbitration policy described above and may be opportunistically sent to PHY interface 30.

At this point, if an activate or pre-charge operation is performed, then the page status for the bank, RCQ, and WCB will need to be updated to reflect the change (step 650). Processing may then loop back to step 620, as indicated by path 657. If no activate/pre-charge operation is performed, read data control 152 may be used to direct PHY 30 to output read data (step 652).

At step 654, read data control 152 may direct read data decoder 154 to decode the read data received from the PHY interface and may also direct read ID queue 150 to output the read ID corresponding to the received read data. At step 656, read data control 152 may then direct the decoded read data to be routed to the corresponding entry in write data buffer 136 via path 192 (see, FIG. 4). Processing may then loop back to step 620, as indicated by path 657.

If the opportunistic read has been done, processing may proceed from step 622 to step 624. At step 624, the page status for the current write command may be checked. If the page is opened, the command may be routed to CAS arbiter 130 (step 628). If the page is closed, the command may be routed to RAS arbiter 128 (step 626). At step 630, commands from the CAS and RAS arbiters may be arbitrated based on the master arbiter arbitration policy described above and may be opportunistically sent to PHY interface 30.

At this point, if an activate or pre-charge operation is performed, then the page status for the bank, RCQ, and WCB will need to be updated to reflect the change (step 634). Processing may then loop back to step 620, as indicated by path 635. If no activate/pre-charge operation is performed, write data buffer 136 may proceed to drain write data (step 636). Write data output in this way may represent data that includes the write data that has been merged with the decoded read data and can then be passed to the PHY interface for writing into the external memory.

Figure 11:
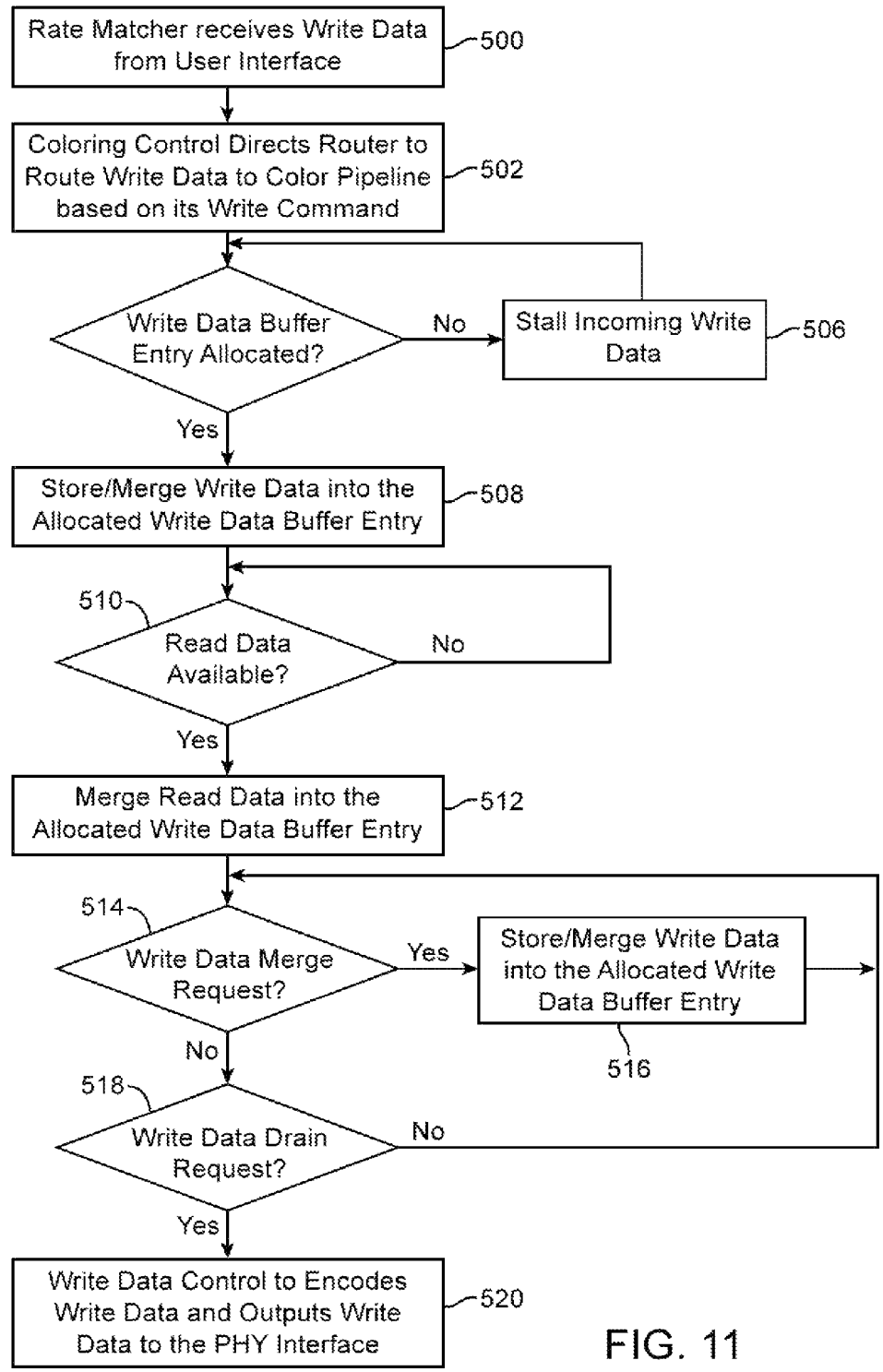
FIG. 11 is a flow chart of illustrative steps for processing write data associated with a read-modify-write command using the memory interface and controller circuitry of FIG. 4 in accordance with an embodiment of the present invention.

FIG. 11 is a flow chart of illustrative steps for processing write data associated with a read-modify-write command. At step 500, rate matcher 106 may receive write data from user logic 26. At step 502, coloring control circuit 108 may analyze the write command and direct router 112 to route the write data to a selected color pipeline 120 based on where the associated read-modify-write command is routed.

If an entry in the write data buffer 136 has not yet been allocated for the new write data, the incoming write data may be temporarily stalled (step 506). If an entry has been allocated for the incoming write data, the incoming write data may be stored/merged into the allocated write data buffer entry (step 508).

At step 510, read data control 152 may check to determine whether any read data is available. If read data is not yet available for merging, processing may be temporarily suspended until the PHY interface returns read data from the external memory. When read data is available, the read data is decoded and then stored into the corresponding allocated entry in write data buffer 136 (step 512).

At step 514, a request to merge the partial write data may be monitored. When this request is present, the partial write data may be merged with the read data in the allocated entry in write data buffer 136 (step 516). Otherwise, processing will proceed to step 518. At step 518, a request to drain the write data buffer may be monitored. Once this request has been detected, write data encoder 142 encodes the selected write data and outputs the encoded write data to the PHY interface 30 (step 520).

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An integrated circuit that communicates with external memory, comprising:
    user logic;
    user interface circuitry that interfaces with the user logic;
    physical layer interface circuitry that interfaces with the external memory; and
    memory controller circuitry interposed between the user interface circuitry and the physical layer interface circuitry, wherein the memory controller circuitry includes a plurality of color pipelines that are operated in parallel to process memory access requests for different portions of the external memory, wherein a first color pipeline of the plurality of color pipelines is assigned to a first portion of the external memory, and wherein a second color pipeline of the plurality of color pipelines is assigned to a second portion of the external memory that is different from the first portion, wherein the first color pipeline includes arbitration circuitry for arbitrating between memory access requests of varying priority for the first portion of the external memory, wherein each color pipeline in the plurality of color pipelines includes a read command queue and a write command buffer, wherein the first color pipeline elevates a priority value for a read access request associated with a given address in the read command queue in response to receiving a write access request associated with the given address at the write command buffer, and wherein the read access request associated with the given address is fulfilled before the write access request associated with the given address in response to the priority value for the read access request associated with the given address being elevated.

2. The integrated circuit defined in claim 1, further comprising:
    a rate matching circuit interposed between the user interface circuitry and the memory controller circuitry.

3. The integrated circuit defined in claim 1, wherein the memory controller circuitry further includes a read data decoder for decoding incoming read data and a read ID queue that stores a read ID associated with the incoming read data.

4. The integrated circuit defined in claim 1, wherein the memory controller circuitry further includes routing circuitry that receives the memory access requests from the user interface circuitry and that routes each of the memory access requests to a selected one of the plurality of color pipelines.

5. The integrated circuit defined in claim 1, wherein each color pipeline in the plurality of color pipelines further includes a write data buffer that stores write data and a write data encoder that encodes the stored write data.

6. The integrated circuit defined in claim 5, wherein each color pipeline in the plurality of color pipelines further includes a row address strobe (RAS) arbiter that arbitrates among different memory bank accesses and a column address strobe (CAS) arbiter that arbitrates between read and write memory access requests.

7. The integrated circuit defined in claim 6, wherein the memory controller circuitry further includes a color arbiter that receives read and write memory access requests from the plurality of color pipelines.

8. The integrated circuit defined in claim 7, wherein the physical layer interface circuitry includes time slicer circuitry that receives and processes memory access requests output from the color arbiter in a time multiplexed fashion.

* * * * *